(12) United States Patent
Van Herpen et al.

(10) Patent No.: US 7,196,343 B2
(45) Date of Patent: Mar. 27, 2007

(54) OPTICAL ELEMENT, LITHOGRAPHIC APPARATUS INCLUDING SUCH AN OPTICAL ELEMENT, DEVICE MANUFACTURING METHOD, AND DEVICE MANUFACTURED THEREBY

(75) Inventors: Maarten Marinus Johannes Wilhelmus Van Herpen, Heesch (NL); Levinus Pieter Bakker, Helmond (NL); Derk Jan Wilfred Klunder, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/025,851

(22) Filed: Dec. 30, 2004

(65) Prior Publication Data

US 2006/0145094 A1  Jul. 6, 2006

(51) Int. Cl.
*G03F 7/20* (2006.01)
*G02B 27/14* (2006.01)

(52) U.S. Cl. ............................ 250/505.1; 250/504 R; 359/634; 359/627; 359/572; 359/350; 359/351; 359/361

(58) Field of Classification Search ............. 250/505.1
See application file for complete search history.

(56) References Cited

U.S. PATENT DOCUMENTS

| | | | |
|---|---|---|---|
| 5,339,346 A * | 8/1994 | White ........................ 378/34 |
| 5,482,830 A * | 1/1996 | Bogart et al. .................. 435/5 |
| 5,494,829 A * | 2/1996 | Sandstrom et al. ......... 436/518 |
| 5,541,057 A * | 7/1996 | Bogart et al. .................. 435/5 |
| 6,072,852 A * | 6/2000 | Hudyma ...................... 378/34 |
| 6,225,027 B1 * | 5/2001 | Replogle et al. ............ 430/311 |
| 6,331,710 B1 * | 12/2001 | Wang et al. ............. 250/492.2 |
| 6,449,086 B1 * | 9/2002 | Singh ........................ 359/361 |
| 6,475,867 B1 * | 11/2002 | Hui et al. ................... 438/299 |
| 6,479,195 B1 * | 11/2002 | Kirchauer et al. ............. 430/5 |
| 6,500,587 B1 * | 12/2002 | Ghandehari et al. ........... 430/5 |
| 6,514,849 B1 * | 2/2003 | Hui et al. ................... 438/618 |
| 6,514,867 B1 * | 2/2003 | Hui et al. ................... 438/713 |
| 6,514,868 B1 * | 2/2003 | Hui et al. ................... 438/713 |
| 6,514,874 B1 * | 2/2003 | Yu et al. ..................... 438/744 |
| 6,528,398 B1 * | 3/2003 | Ghandehari et al. ........ 438/551 |
| 6,555,828 B1 * | 4/2003 | Bokor et al. ............. 250/492.2 |
| 6,602,794 B1 * | 8/2003 | Kye .......................... 438/725 |
| 6,664,180 B1 * | 12/2003 | Hui et al. ................... 438/637 |
| 6,673,684 B1 * | 1/2004 | Huang et al. ............... 438/299 |
| 6,806,965 B2 * | 10/2004 | Deck .......................... 356/512 |
| 6,809,327 B2 * | 10/2004 | Bristol ................... 250/504 R |
| 6,825,988 B2 * | 11/2004 | Bristol ....................... 359/634 |
| 6,859,328 B2 * | 2/2005 | Schultz et al. .............. 359/633 |
| 6,891,655 B2 * | 5/2005 | Grebinski et al. .......... 359/291 |
| 6,924,492 B2 * | 8/2005 | Van Schaik .............. 250/492.1 |
| 6,946,669 B2 * | 9/2005 | Kleinschmidt .......... 250/504 R |
| 6,972,421 B2 * | 12/2005 | Melnychuk et al. .... 250/504 R |
| 6,994,444 B2 * | 2/2006 | del Puerto .................. 359/883 |
| 2002/0176092 A1 * | 11/2002 | Deck .......................... 356/515 |
| 2004/0051954 A1 * | 3/2004 | Bristol ....................... 359/634 |
| 2004/0155207 A1 * | 8/2004 | Kleinschmidt .......... 250/504 R |
| 2004/0214113 A1 * | 10/2004 | Goldstein et al. ........... 430/322 |
| 2005/0084773 A1 * | 4/2005 | Krauth ......................... 430/5 |
| 2005/0157383 A1 * | 7/2005 | Tichenor et al. ............ 359/359 |
| 2005/0205811 A1 * | 9/2005 | Partlo et al. ............ 250/504 R |

(Continued)

*Primary Examiner*—Nikita Wells
*Assistant Examiner*—Bernard Souw
(74) *Attorney, Agent, or Firm*—Pillsbury Winthrop Shaw Pittman, LLP

(57) ABSTRACT

An optical element including an anti-reflection (AR) coating is configured to reflect Extreme-Ultra-Violet (EUV) radiation only.

25 Claims, 10 Drawing Sheets

U.S. PATENT DOCUMENTS

2005/0207039 A1* 9/2005 Singer et al. .............. 359/858
2005/0230645 A1* 10/2005 Melnychuk et al. .... 250/504 R
2006/0008749 A1* 1/2006 Sobel et al. ............... 430/394
2006/0145094 A1* 7/2006 Wilhelmus ............... 250/492.2
2006/0146413 A1* 7/2006 Klunder et al. ............ 359/634

* cited by examiner

OPTICAL ELEMENT, LITHOGRAPHIC APPARATUS INCLUDING SUCH AN OPTICAL ELEMENT, DEVICE MANUFACTURING METHOD, AND DEVICE MANUFACTURED THEREBY

BACKGROUND OF THE INVENTION

1. Field of the Invention

The present invention relates to an optical element, a lithographic apparatus including such an optical element, a device manufacturing method, and a device manufactured thereby.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In addition to Extreme Ultra-Violet (EUV) radiation, an EUV source emits many different wavelengths of light. This non-EUV radiation may be harmful for the EUV lithography system, so it should be removed by a spectral purity filter. Present spectral purity filters are based on blazed gratings. These gratings may be difficult to produce, since the surface quality of the triangular shaped pattern has to be very high. The roughness of the surface should be lower than 1 nm RMS.

SUMMARY OF THE INVENTION

It is an aspect of the present invention to provide a spectral purity filter that reflects EUV radiation and is designed so that unwanted radiation is not reflected.

According to an embodiment of the present invention, an optical element includes an anti-reflection coating, wherein the anti-reflection coating is configured to reflect EUV radiation and thereby improve the spectral purity of a radiation beam.

The anti-reflection coating may be configured to reflect EUV radiation only.

By enhancing the spectral purity, this may increase the proportion of EUV radiation in the radiation beam. The proportion of EUV radiation to, for example, IR radiation may therefore increase by reflecting the radiation beam from an optical element according to the present invention.

The optical element including the anti-reflection coating may, for example, be a spectral purity filter such as a grazing incidence mirror or a collector.

The anti-reflection coating may be designed in such a way that unwanted radiation (i.e. non-EUV) is not reflected. EUV radiation may be reflected and other radiation such as IR and UV may be transmitted therethrough. About 70–90% of the EUV radiation may be reflected.

The anti-reflection coating uses destructive interference of light and the dependence of the reflectivity on index of refraction to reflect EUV radiation and not reflect unwanted radiation such as DUV and IR radiation.

The thickness of the anti-reflection coating may, for example, be dependent on the wavelength of radiation used and the radiation to be suppressed. In an embodiment, for a grazing angle of 5°, about a 50–90 nm thick $CaF_2$ layer may be used. In addition, about a 20–50 nm thick layer of diamond may be used. The thickness of the anti-reflection coating may be slightly less than $\frac{1}{4}\lambda$, as it is not the thickness that needs to be $\frac{1}{4}\lambda$, but the optically travelled distance of the radiation.

The present invention therefore relates to the suppression of unwanted radiation. For example, DUV suppression herein means the reflectivity of DUV light divided by the reflectivity of EUV light. Reference to suppression therefore allows one to determine how much the power ratio between DUV and EUV radiation improves. A suppression of 10% therefore means that the amount of DUV compared to EUV is reduced to 10% of its original value.

The anti-reflection coating may include any suitable anti-reflection material. For example, any combination of the following may be used: magnesium fluoride ($MgF_2$), silicon dioxide ($SiO_2$), titanium dioxide ($TiO_2$), calcium fluoride ($CaF_2$), diamond, amorphous carbon, TiN, SiC and $Si_3N_4$.

The optical element may have a size of about 4 cm×20 cm.

The grazing incidence mirror may be configured to obtain small grazing angles of incidence such as about 5° which are required to be placed in an intermediate focus of a EUV lithography apparatus. The grazing incidence mirror may therefore include at least two non-planar sections each configured to reflect the radiation. The grazing incidence mirror may be configured to create two reflections in order to create two reflections with both reflections having a different polarization direction for the anti-reflection coating. The grazing incidence mirror may be substantially cross-shaped in order to create the two reflections. The EUV radiation may be reflective on both sides of the surface of the grazing incidence mirror in order to reduce the angle of incidence. The cross-shaped mirror may have dimensions of around 4 cm×4 cm×20 cm.

The grazing incidence mirror may therefore be placed in the intermediate focus in order to reduce the angle of incidence.

As the EUV radiation may be reflected from the anti-reflection coating, a substrate underneath may be designed to improve the anti-reflection properties of the optical element. The substrate may be made from any suitable metal or alloy which has good heat conductivity. The substrate may be made from silicon or copper. The substrate may absorb the light that is being suppressed which helps to prevent transmitted light from entering the lithography apparatus. Moreover, the substrate may have a low thermal expansion coefficient.

To broaden the suppression of unwanted radiation such as DUV and IR, a coating material may be used which has a low natural grazing incidence reflectivity at other wavelengths, for example in the UV range. For example, the substrate may have a coating of diamond of about 40 mm thickness. The diamond has low grazing incidence reflectivity in the UV range. In certain embodiments, it may therefore be desirable to use an anti-reflection coating which has a natural suppression of light at other wavelengths.

According to a further embodiment of the present invention, a lithographic apparatus includes an illumination system configured to condition a radiation beam; a support configured to support a patterning device, the patterning device being configured to impart the radiation beam with a pattern in its cross-section to form a patterned radiation beam; a substrate table configured to hold a substrate; a projection system configured to project the patterned radiation beam onto a target portion of the substrate; and at least one optical element configured to reflect EUV radiation and thereby improve the spectral purity of the radiation beam.

The at least one optical element may be a grazing incidence mirror with an anti-reflection coating.

According to another embodiment of the present invention, a lithographic apparatus includes an optical element, the optical element including an anti-reflection coating, wherein the optical element is configured to reflect EUV radiation and thereby improve the spectral purity of a radiation beam.

The at least one optical element may be a grazing incidence mirror.

According to a further embodiement of the present invention, a device manufacturing method includes providing a radiation beam; patterning the radiation beam; projecting the patterned beam of radiation onto a target portion of the substrate; and reflecting the radiation beam with an optical element including an anti-reflective coating configured to reflect EUV radiation and thereby improve the spectral purity of the radiation beam.

The at least one optical element may be a grazing incidence mirror.

According to a further embodiment of the present invention, a device is manufactured according to a method including providing a radiation beam; patterning the radiation beam; projecting the patterned beam of radiation onto a substrate; and reflecting the radiation beam with at least one optical element configured to reflect EUV radiation and thereby improve the spectral purity of the radiation beam.

The at least one optical element may be a grazing incidence mirror.

The manufactured device may, for example, be integrated circuits (ICs), integrated optical systems, guidance and detection patterns for magnetic domain memories, liquid crystal displays (LCDs) and thin-film magnetic heads.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
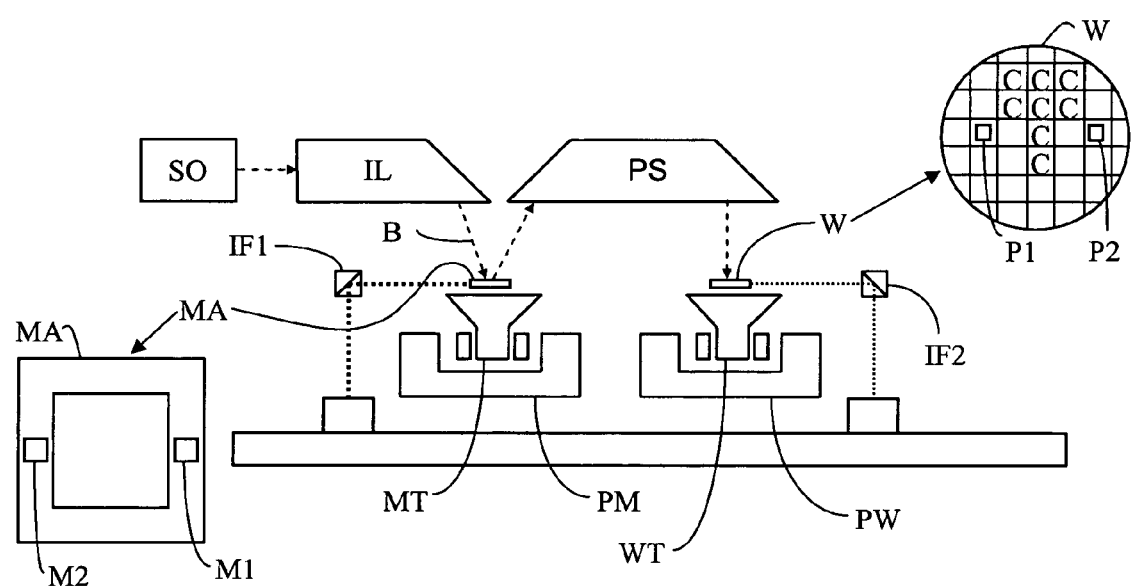
FIG. 1 depicts a lithographic apparatus according to an embodiment of the present invention.

FIG. 1 schematically depicts a lithographic apparatus according to one embodiment of the invention. The apparatus includes an illumination system (illuminator) IL configured to condition a radiation beam B (e.g. UV radiation or EW radiation). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (which may be an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
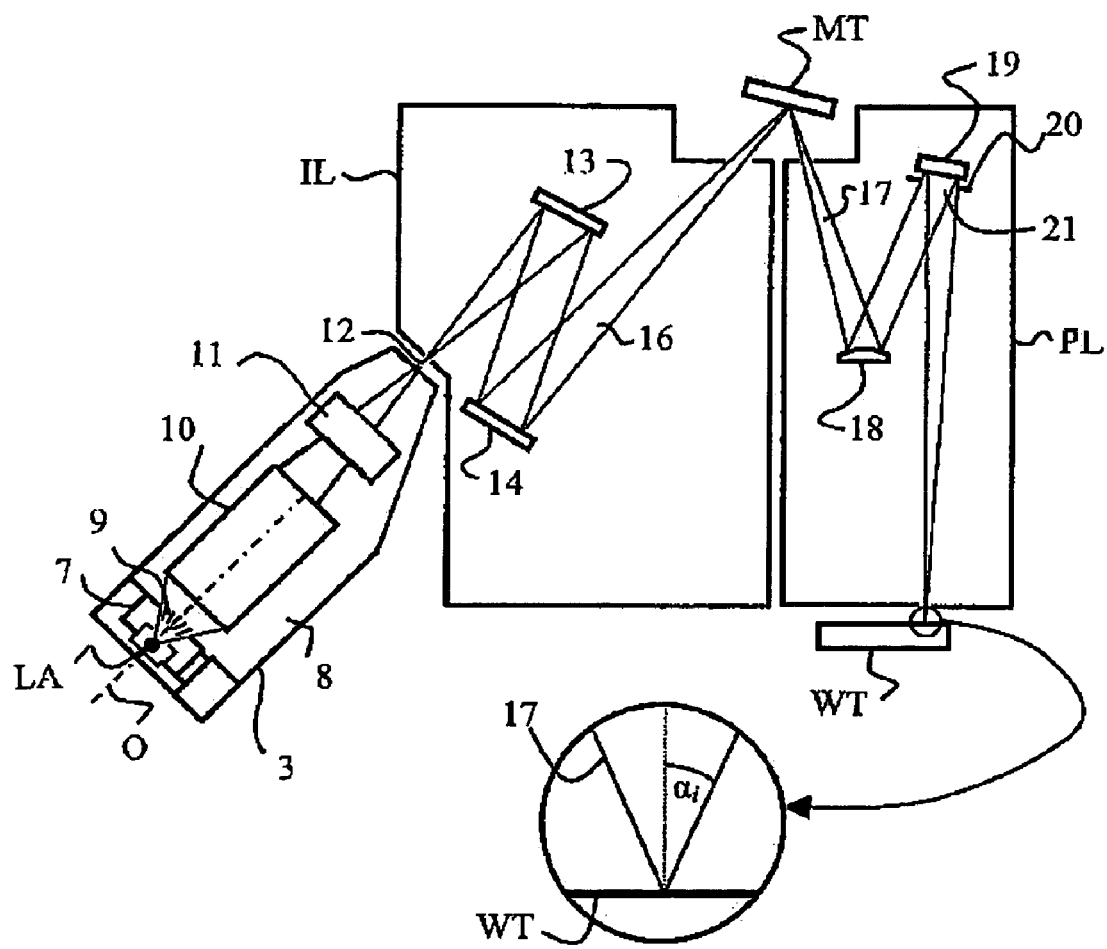
FIG. 2 depicts a lithographic apparatus for use with Extreme Ultra-Violet (EUV) radiation according to an embodiment of the present invention.

FIG. 2 shows a side view of an EUV lithographic apparatus in accordance with an embodiment of the present invention. It will be noted that, although the arrangement is different to that of the apparatus shown in FIG. 1, the principle of operation is similar. The apparatus includes a source-collector-module or radiation unit 3, an illumination system IL and a projection system PL. Radiation unit 3 is provided with a radiation source LA which may employ a gas or vapor, for example Xe gas or Li vapor in which a very hot discharge plasma is created so as to emit radiation in the EUV range of the electromagnetic radiation spectrum. The discharge plasma is created by causing a partially ionized plasma of an electrical discharge to collapse onto the optical axis O. Partial pressures of 0.1 m bar of Xe, Li vapor or any other suitable gas or vapor may be required for efficient generation of the radiation. The radiation emitted by radiation source LA is passed from the source chamber 7 into collector chamber 8 via a gas barrier structure or "foil trap" 9. The gas barrier structure includes a channel structure such as, for instance, described in detail in U.S. Pat. Nos. 6,614,505 and 6,359,969, which are incorporated herein by reference. The collector chamber 8 includes a radiation collector 10 which is formed, for example, by a grazing incidence collector. Radiation passed by collector 10 transmits through an optical element 11 according to the present invention which includes an anti-reflection coating. It should be noted that in contrast to blazed spectral purity filters, the optical element 11 does not change the direction of the radiation beam. In an alternative embodiment, although not shown, the optical element 11 may reflect the radiation beam as the optical element 11 may be implemented in the form of a grazing incidence mirror or on the collector 10. The radiation is focused in a virtual source point 12 (i.e. an intermediate focus) from an aperture in the collection chamber 8. From chamber 8, the projection beam 16 is reflected in illumination system IL via normal incidence reflectors 13,14 onto a reticle or mask positioned on reticle or masked table MT. A patterned beam 17 is formed which is imaged by projection system PL via reflective elements 18,19 onto wafer stage or substrate table WT. More elements than shown may generally be present in the illumination system IL and projection system PL.

One of the reflective elements 19 has in front of it an NA disc 20 having an aperture 21 therethrough. The size of the aperture 21 determines the angle $\alpha_i$ subtended by the radiation beam 17 as it strikes the substrate table WT.

The present invention relates to spectral purity filters including materials which are used for anti-reflection coatings which show reasonable reflection for EUV radiation. The present invention therefore relates to a substrate with an anti-reflection coating which is used as a mirror for EUV radiation. The anti-reflection coating is designed in such a way that unwanted radiation (i.e. non-EUV) is not reflected. This allows a spectral purity filter to be made using a grazing incidence mirror which has an anti-reflection coating.

Figure 3:
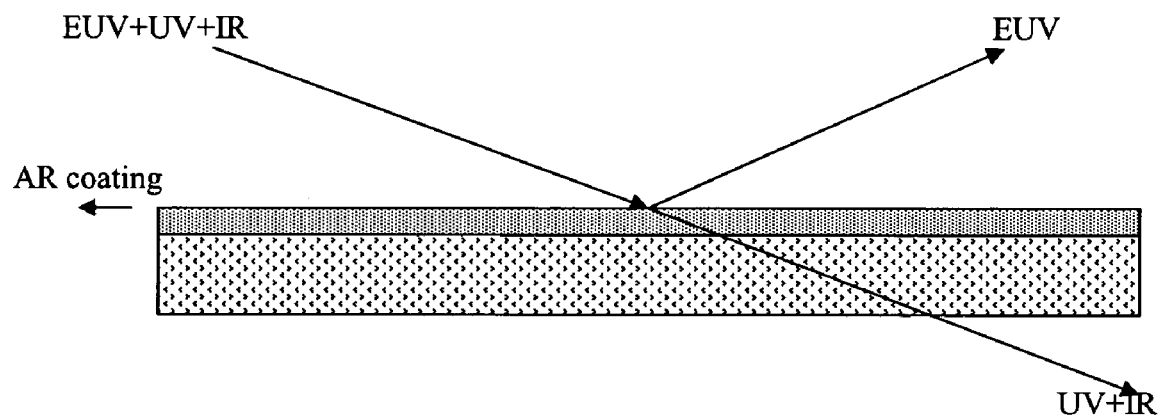
FIG. 3 depicts an anti-reflection (AR) coating which reflects Extreme Ultra-Violet (EUV) radiation.

FIG. 3 relates to the principle of an anti-reflection (AR) coating on a substrate wherein EUV radiation is reflected and UV and IR radiation is transmitted therethrough or absorbed by the substrate. The substrate in FIG. 3 is made from silicon.

The anti-reflection coating, as shown in FIG. 3, is made from any suitable material which has anti-reflection properties. For example, materials such as magnesium fluoride ($MgF_2$), calcium fluoride ($CaF_2$), silicon dioxide ($SiO_2$), titanium dioxide ($TiO_2$), diamond, carbon and in particular amorphous carbon, TiN, SiC and $S_3N_4$ may be used.

An anti-reflection coating takes advantage of the wave nature of the light, and in particular the phenomenon of destructive interference of light and the dependence of the reflectivity on index of refraction. By covering a surface (i.e. a substrate) with a single coating of about ¼λ thickness or less than about ¼λ thickness, the reflections of radiation with that specific λ are eliminated since the ray reflected at the top surface is 180° out of phase with the ray reflected at the lower surface i.e. destructive interference occurs. Additionally, using multi-layer coatings it is possible to reduce the light loss over a broader range of the spectrum. It should be noted that due to the grazing angle, the thickness of the anti-reflection coating may need to be adjusted as in reality, the thickness of the anti-reflection coating will be smaller than ¼λ as it is not the thickness that needs to be ¼λ, but the optically travelled distance of the light.

For example, a diamond anti-reflection coating of a thickness of about 20–50 nm or about 50–90 nm of $CaF_2$ is used.

Figure 4:
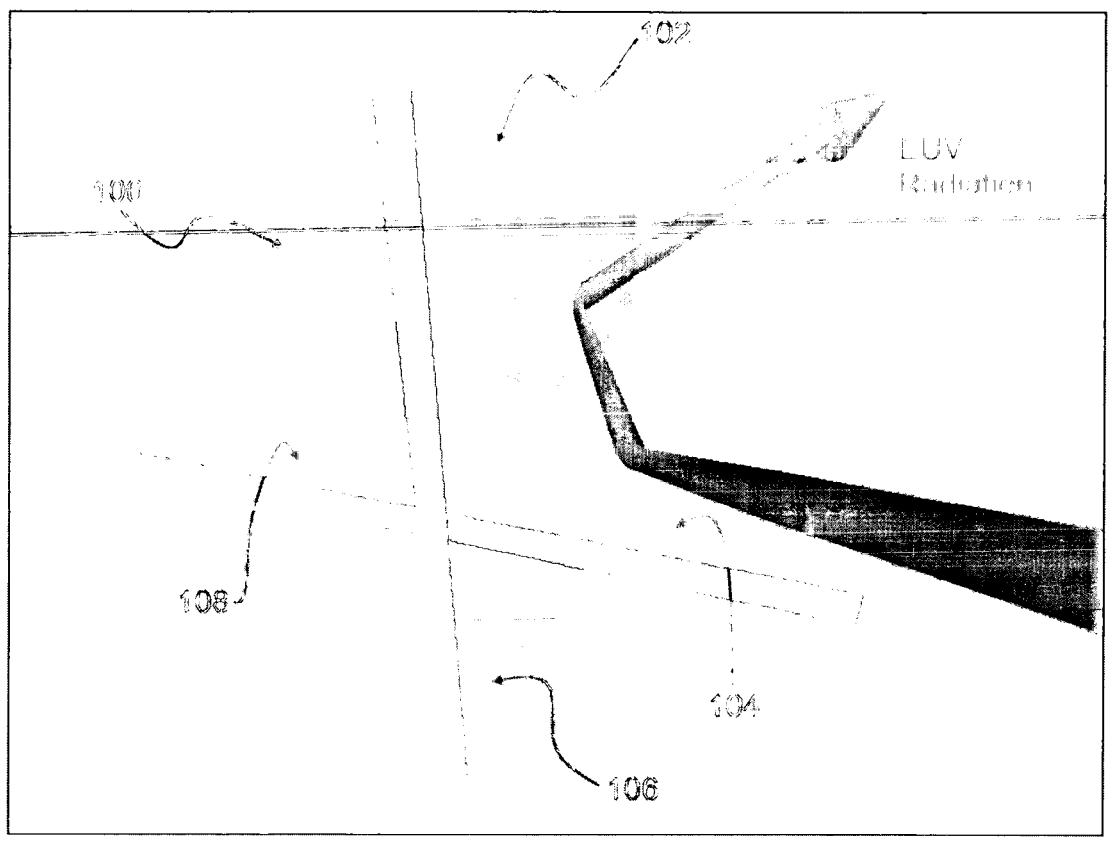
FIG. 4 depicts a substantially cross-shaped grazing incidence mirror according to an embodiment of the present invention.

However, it should be noted that the above embodiment using the mentioned materials are only efficient as EUV reflectors, when the angle of incidence with the respect to the surface of the mirror is small i.e. less than about 10°, for example less than about 5°. In order to be able to get small grazing angle of incidence (such as about 5°), the spectral purity filter may be placed in the intermediate focus of the EUV lithography set-up. It should be noted that the 5° angle is a calculated average angle of incidence value as in reality a range of angles will be present. The range of angles may be about 5°–7°. Because the performance of the anti-reflection coating depends on the polarization of the incoming radiation, an embodiment of the present invention is to have the spectral purity filter substantially in the shape of a cross in order to create two reflections with both the reflections having a different polarization for the anti-reflection coating. The spectral purity filter 100 in FIG. 4 clearly shows the cross-shape and the reflected EUV light. FIG. 4 shows that the spectral purity filter 100 includes four planar portions 102, 104, 106, 108 in a cross-shape configuration. The EUV light in FIG. 4 is reflected off portions 102, 104 of the spectral purity filter 100 shown in FIG. 4 in order to reduce the angle of incidence.

Figure 5:
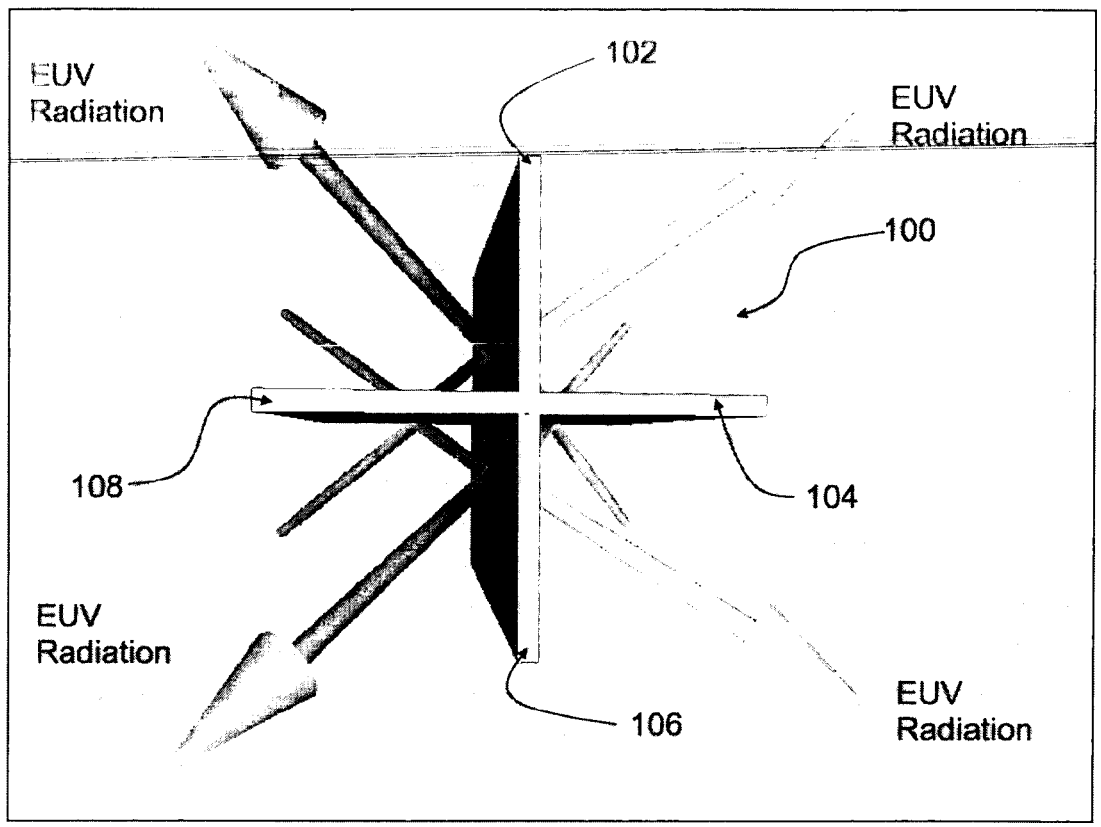
FIG. 5 depicts the cross-shaped spectral purity filter shown in FIG. 4 in an intermediate focus of a lithographic apparatus.

FIG. 5 shows how this is achieved by placing the spectral purity filter 100 in the intermediate focus of a lithographic apparatus. FIG. 5 shows an image as to how the cross-shape of the spectral purity filter 100 can be placed in the intermediate focus in order to reduce the angle of incidence of the surface. FIG. 5 also shows different light rays that are coming in from a different angle.

EUV radiation will therefore reflect from the top of the anti-reflection coating. The reflectivity for EUV depends on the angle of incidence and on the type of material that is used for the anti-reflection coating.

The angle of incidence in the intermediate focus of the source-collector-module will be about 5°. Table 1 below lists some materials used for anti-reflection coatings and their grazing incidence reflectivity at 5°:

TABLE 1

| Material | Grazing incidence reflectivity at 5° |
|---|---|
| $TiO_2$ | 82% |
| $CaF_2$ | 77% |

TABLE 1-continued

| Material | Grazing incidence reflectivity at 5° |
|---|---|
| SiO$_2$ | 68% |
| MgF$_2$ | 65% |

The type of material used for the anti-reflection coating depends on the wavelength that it needs to work for. For example, for VUV (130–250 nm) radiation CaF$_2$ is a good choice, which has 77% reflectivity for EUV radiation. Taking the losses for two reflections (due to the cross-shape of the spectral purity filter), this results in a total reflectivity of EUV radiation of 59%, which is acceptable for a spectral purity filter. In practice the reflectivity will be higher, because not all incident light beams will enter at 5°, but the angles range from 0° to 5°. Therefore a better estimation of the total EUV reflectivity is about 70–80%.

A simple ¼ λ layer can be used as an anti-reflection coating. For the grazing angle of 5°, an 80 nm thick CaF$_2$ layer results in no reflected p-polarised light of wavelength 200 nm. By tuning the thickness of the layer, the anti-reflection curve can be tuned. For a single quarter wave layer, the reflectivity stays below 1% in a 4 nm wavelength band around 200 nm. By having a multilayer anti-reflection coating, this band will increase dramatically. As the EUV radiation is reflected on the top surface, the stack underneath can be freely designed in order to improve the anti-reflection. This means that it does not matter what other materials are used beneath the anti-reflection coating. This allows extra reduction of DUV reflectivity, extra absorbance for DUV, improved material properties for the substrate such as thermal conductivity.

For good thermal stability, the absorbed power has to be transported over approximately 2 cm, in a sheet of silicon of approximately 1 mm thickness, and length 10 cm. Using an acceptable temperature difference of 200 K, this yields a maximum absorbed power of 200×(150×1×10$^{-3}$×10×10$^{-2}$/2×10$^{-2}$)=200 Kelvin×0.75 W/Kelvin=150 Watt for one sheet. However, the spectral purity filter of the present invention consists of a cross made of two sheets, so the maximum allowed absorbed power is 300 Watt.

Using an absorbed power of 300 Watt, it is also possible to calculate the temperature using radiation cooling. This temperature is 600 K, which means that conduction of heat is a desirable method to use.

The total in-band EUV power required in the intermediate focus is in the order of 120 W, giving a total EUV emission of around 800 W. Using the estimated EUV reflectivity of 70–80%, this gives an EUV absorption of 20–30%, which is 160–240 Watt. This means that a maximum of 60–140 W is allowed to be absorbed by the spectral purity filter if the temperature difference of 200 K is not to be exceeded. This gives enough room to be able to filter out most of the DUV power.

In addition to this calculation there are also several other options to increase the total allowed absorbed power:

1. Increase the thickness of the sheets: In this calculation a 1 mm thickness is used. If the thickness is increased to 2 mm, the total allowed absorption doubles. The extra absorbed power can all be used to absorb outside the EUV range.

2. Use a different substrate material: For example, if copper is used instead of silicon, then the total allowed absorbed power doubles.

3. Active cooling: For instance with micro-channels the cooling rate can be increased considerably.

4. Increase temperature difference: Depending on the properties of the material used for the anti-reflection coating, a higher allowed temperature difference can be used.

The above method is desirable because:

1. It is less expensive and easier to produce than current spectral purity filters.

2. It lowers losses compared to current spectral purity filters.

3. It strongly suppresses light intensities at targeted wavelengths. This means that it can be used to strongly suppress UV wavelengths that have too high intensities at wafer-level, for which the photo-resist is sensitive.

4. It is usable for visible or infrared wavelengths, next to the UV region. In those wavelength ranges this invention is expected to have an even better performance (other materials can be used).

5. The EUV radiation is reflected on the top surface. Therefore, the multi-layer stack underneath can be freely designed in order to improve the anti-reflection.

6. The use of the cross-shaped reflector in the intermediate focus reduces the angle of incidence for the light beams, resulting in a higher reflectivity.

However, the grazing incidence mirror described above may be improved in a number of ways. Firstly, the suppression with a grazing incidence anti-reflection coating is not very broad. Secondly, the grazing incidence mirror may introduce unwanted losses into the system.

Figure 6:
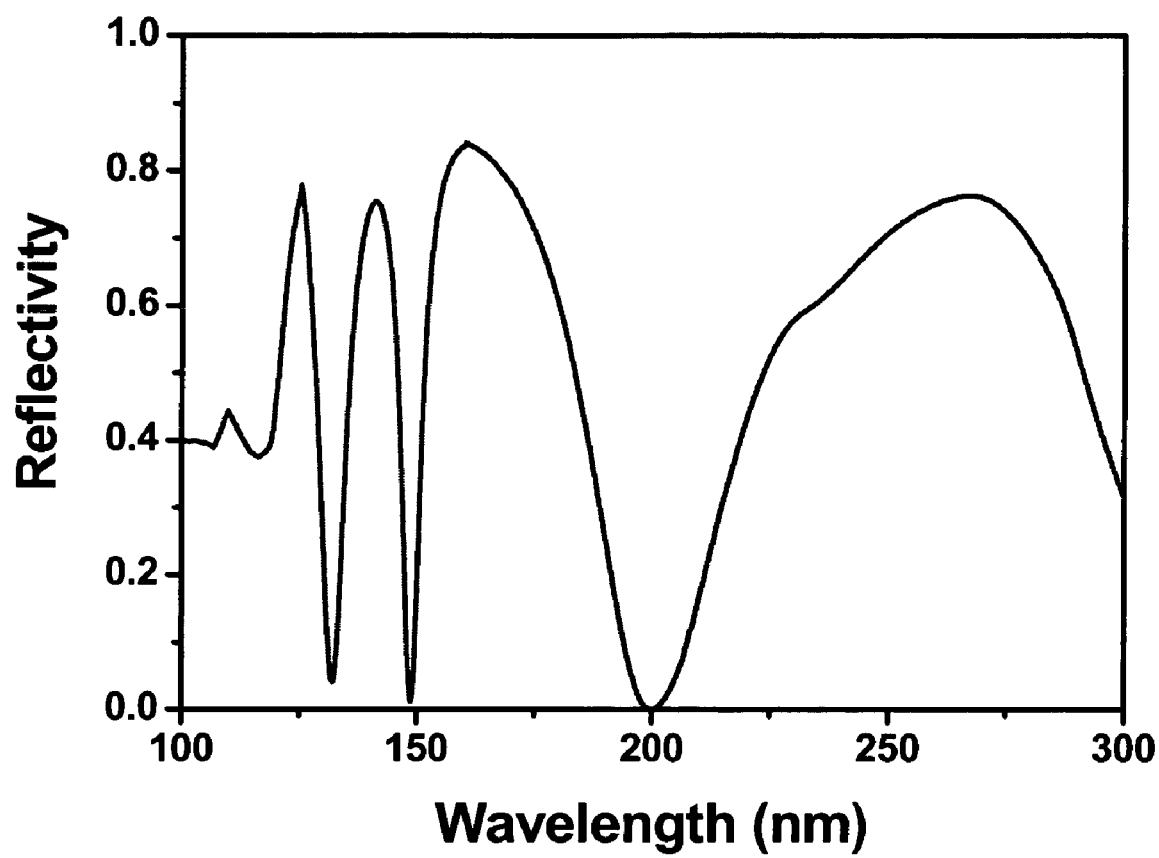
FIG. 6 depicts a reflectivity curve for $CaF_2$ on silicon using a substantially cross-shaped grazing incidence mirror and a grazing incidence angle of 5°.
Figure 7:
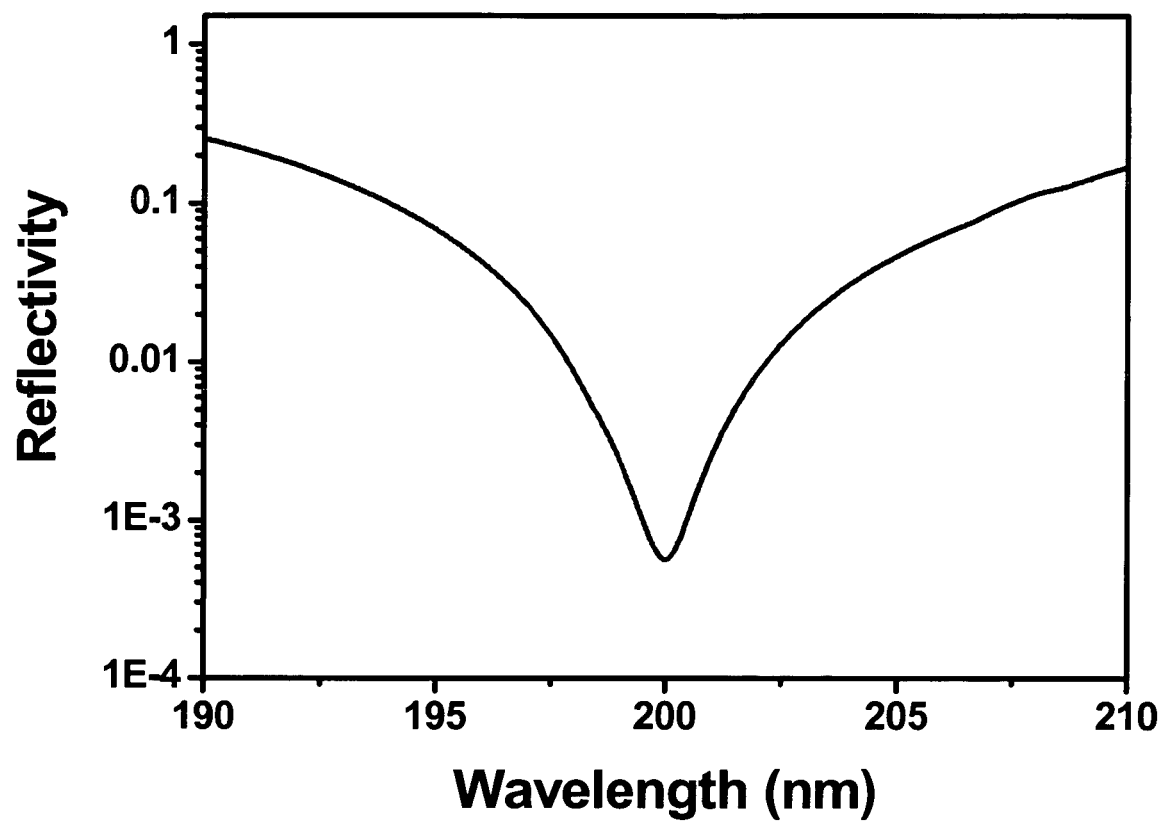
FIG. 7 depicts a reflectivity curve of a substantially cross-shaped grazing incidence mirror in the 200 nm range.

FIG. 6 shows the DUV reflectivity from the cross-shaped spectral purity filter shown in FIGS. 4 and 5. It is calculated by multiplying the contributions from S and P polarizations for a grazing angle of incidence of 5°, using an anti-reflection coating of 73 nm CaF$_2$ on silicon. FIG. 6 shows that the cross-shaped spectral purity filter works well, but only for wavelengths in a rather small wavelength range. However, in that wavelength range the reflectivity can be as low as 0.0006 (see FIG. 7), which corresponds with more than 3 orders of magnitude suppression. This means that the cross-shaped spectral purity filter is very suited to enhance spectral purity if the wavelengths to suppress are emitted at certain frequencies. This could, for example, be the case for a Lithium EUV-source.

A solution to the small bandwidth suppression of the cross-shaped spectral purity filter is to make the suppression broader by using a coating material that has a low "natural" grazing incidence reflectivity in the UV range. An example of this is shown in FIG. 8 which is a reflectivity curve of a cross-shaped spectral purity filter including a diamond anti-reflection coating.

Figure 8:
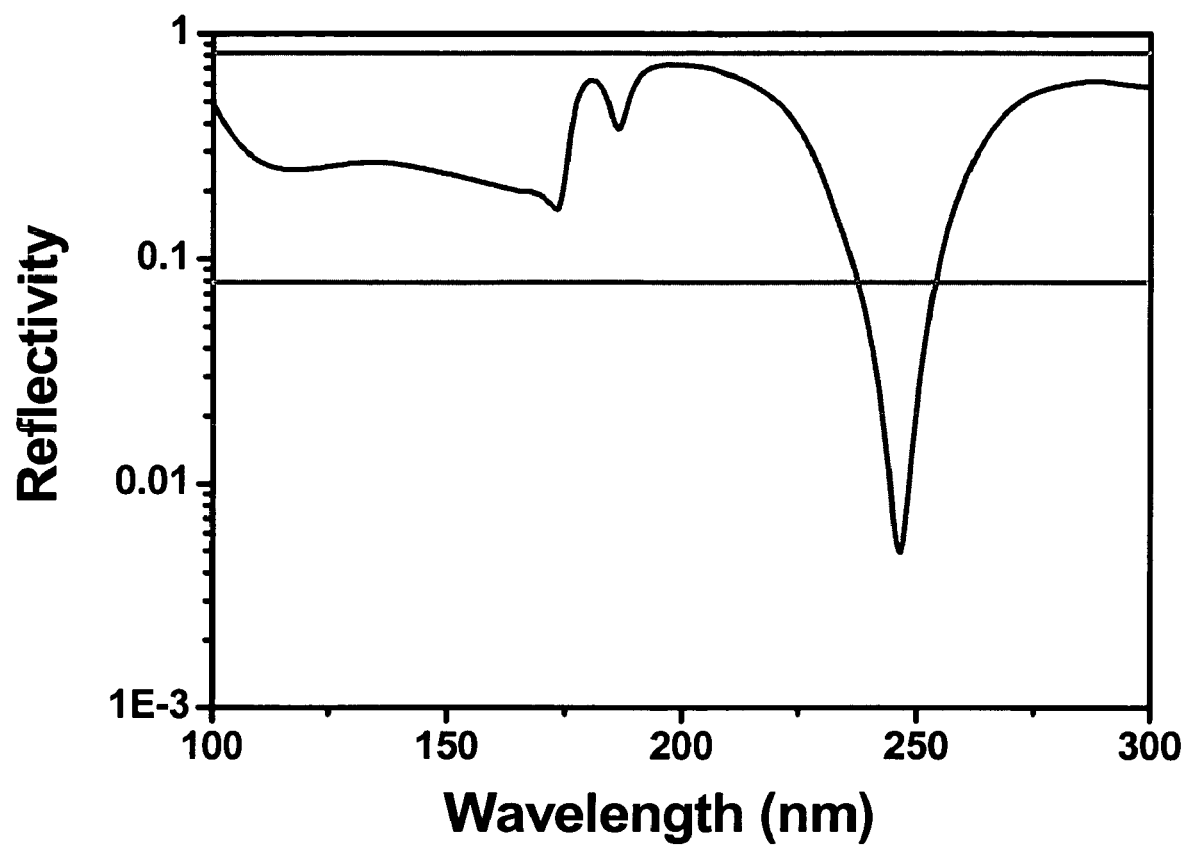
FIG. 8 depicts a reflectivity curve of a cross-shaped spectral purity filter including a diamond anti-reflection coating.

In particular, FIG. 8 relates to a cross-shaped spectral purity filter composed of a layer of about 40 nm diamond on silicon. Because diamond has low grazing incidence reflectivity in the UV range, some DUV suppression can be achieved in this range, in addition to the normal anti-reflection suppression, which lies around 250 nm in this case. The reflectivity curve was calculated for a grazing incidence angle of 5°. The horizontal lines indicate the EUV reflectivity and 10% of the EUV reflectivity.

The cross-shaped spectral purity filter generally has very low losses of, for example 20–30% for a CaF$_2$ coating. However, these losses can be further reduced by applying an anti-reflection coating to the existing grazing incidence mirrors in the lithography system, instead of introducing a cross-shaped spectral purity filter in the system.

For example, referring to FIG. 2, grazing incidence mirrors may be coated with an anti-reflection coating and located in the illumination system IL in front of or near the reticle. Table 2 compares the grazing incidence reflectivity for several different materials. What Table 2 is showing is that when using, for example $CaF_2$ instead of Ru, the grazing incidence EUV reflectivity for 7° goes from 92% to 76%, which is an extra EUV loss of 16% instead of the losses of 24% that would occur if an extra grazing incidence mirror is introduced into the system. Table 2: Grazing incidence reflectivity at 7° for several materials

| Material | 7° EUV reflectivity |
|---|---|
| Ru | 91.6% |
| Diamond | 87.2% |
| amorphous-Carbon | 83.8% |
| MgF2 | 76.6% |
| CaF2 | 76.0% |
| TiO2 | 73.9% |

In order to reduce the losses of the cross-shaped spectral purity filter it is useful to use the existing grazing incidence mirrors. For example, the collector could be coated with an anti-reflection coating, or the cross-shaped spectral purity filter could be replaced with a single plate (that will give just one reflection instead of two), and this single plate is then combined with an anti-reflection coating on an existing grazing incidence mirror to achieve suppression for both S and P polarization.

Figure 9:
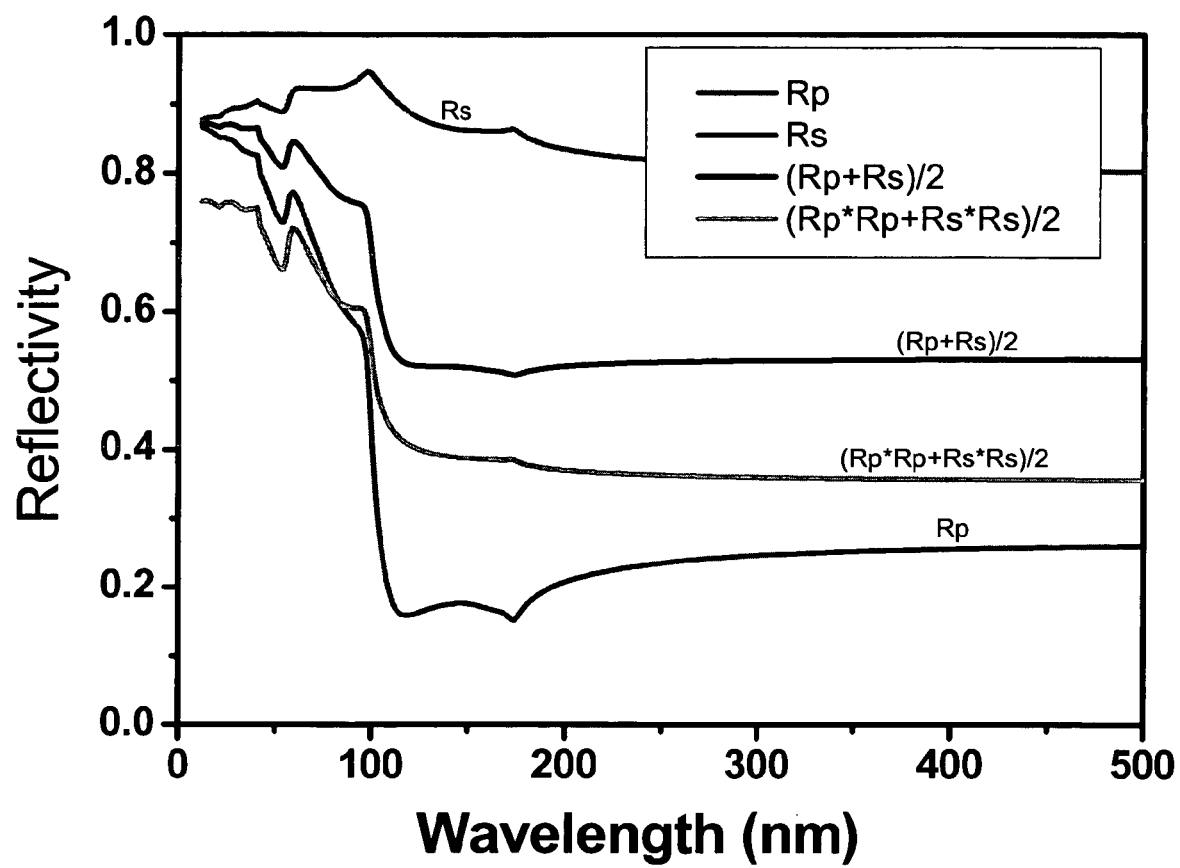
FIG. 9 depicts grazing incidence diamond reflectivity for P and S polarization.

Some materials have a rather low grazing incidence reflectivity for DUV. An example of this is shown in FIG. 9, which shows the polarization-dependant grazing incidence reflectivity of diamond in the DUV wavelength range. FIG. 9 relates to grazing incidence diamond reflectivity with 7° angle. If there are reflections for both P and S polarization then the Rp curve could be achieved for total reflectivity. However, as the collector has two reflections that are either both P or both S polarization, an average is achieved between Rp and Rs. Note that roughly 60% of the DUV-UV would not be reflected by a diamond-coated collector. It should be noted that in this embodiment no anti-reflection effects are used (i.e. the layer of diamond is relatively thick).

In FIG. 9, the (Rp×Rp+Rs×Rs)/2 line shows that roughly 60% of the DUV-UV would be absorbed by a diamond-coated collector. Applying an anti-reflection coating on a grazing incidence mirror to enhance spectral purity will not work if the anti-reflection coating is only applied to the collector. This is because in the collector the plane of the reflections is the same for both reflections, leading to two reflections for the same polarization, while for a good performance of a grazing incidence anti-reflection coating it is necessary to have reflections for both P and S polarizations.

It should be noted that a thin layer of diamond on silicon cannot always achieve an anti-reflection effect on the collector, because it has two reflections for the same polarization. Due to this, the anti-reflection coating can also improve the reflectivity for wavelengths other than the one it is suppressing. In such cases, it can sometimes be desirable to use a thick diamond layer in order to only use the "naturally" low grazing-incidence reflectivity.

Figure 10:
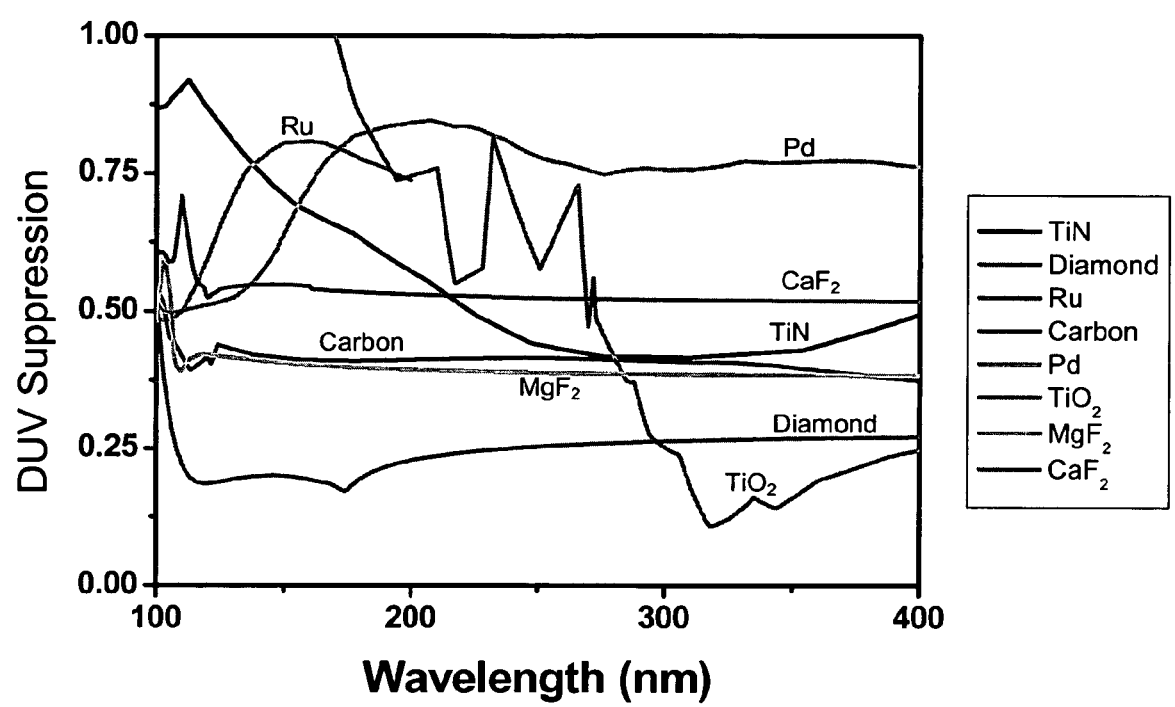
FIG. 10 depicts grazing incidence reflectivity of several different substrates at an angle of 7°.

FIG. 10 shows grazing incidence reflectivity curves for several different materials at an angle of 7°. In particular, FIG. 10 shows the suppression per reflection in the case where two reflections are used that are arranged for both S and P polarization. Table 3 and Table 4 summarize the average DUV suppression from 100–200 nm for these materials, with the corresponding EUV reflectivity. It should be noted that Table 3 and Table 4 give values for the collector, and thus for these Tables the calculation is done for two reflections where the polarization was the same (i.e. different from FIG. 12). As previously described, DUV suppression relates to the reflectivity of DUV light divided by the reflectivity of EUV light.

If only half the collector is coated with diamond, then Table 3 applies. If the entire collector is coated with diamond, then Table 4 applies.

TABLE 3

Average DUV suppression from 100–200 nm for the first reflection

| Material | 7° EUV reflectivity | 7° DUV suppression | Extra EUV loss compared to Ru |
|---|---|---|---|
| Ru | 91.6% | 85% | 0.0% |
| Diamond | 87.2% | 61% | 4.8% |
| Amorphous C | 83.8% | 69% | 8.5% |
| Pd | 82.8% | 81% | 9.6% |
| MgF$_2$ | 76.6% | 67% | 16.4% |

TABLE 4

Average DUV suppression from 100–200 nm for two reflections with the same polarization

| Material | 7° EUV reflectivity | 7° DUV suppression | Extra EUV loss compared to Ru |
|---|---|---|---|
| Ru | 83.9% | 74% | 0.0% |
| Diamond | 76.1% | 53% | 9.3% |
| Amorphous-C | 70.2% | 53% | 16.3% |
| Pd | 68.6% | 69% | 18.2% |
| MgF$_2$ | 58.7% | 50% | 30.0% |

It is clear that materials such as diamond, carbon or $MgF_2$ improve the spectral purity of the reflected light with minor additional losses for the EUV light compared to the currently used Ru.

It can therefore be seen that using different materials than Ru for grazing incidence mirrors, a better spectral purity can be achieved in the UV wavelength range. Examples of such materials are diamond, amorphous carbon and $MgF_2$.

For example, if the collector is made with diamond it has 53% DUV suppression, compared to 74% for a Ru-collector. This means that compared to the Ru-collector, the use of a diamond collector will improve the ratio of EUV power/DUV power by 1−(0.74/0.53)=~40% with ~10% EUV loss.

An even better technique would be to arrange two grazing incidence mirrors in such a way that they reflect for both P and S polarizations. In that way the suppression is considerably higher. For example two diamond-coated grazing incidence mirrors can improve the ratio of EUV power/DUV-UV power by one order of magnitude, with just 10% extra loss of EUV compared to two grazing incidence Ru mirrors.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the term "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The descriptions above are intended to be illustrative, not limiting. Thus, it should be appreciated that modifications may be made to the present invention as described without departing from the scope of the claims set out below.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm), X-ray and extreme ultraviolet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it should be appreciated that the present invention may be practiced otherwise than as described. For example, the present invention may take the form of a computer program containing one or more sequences of machine-readable instructions executable by a programmed general purpose computer or an ASIC to instruct an apparatus to perform a method as disclosed above, or a data storage medium (e.g. semiconductor memory, magnetic or optical disk) having such a computer program stored therein.

What is claimed is:

1. An optical element comprising an anti-reflection coating, wherein the anti-reflection coating is configured to reflect EUV radiation and thereby improve the spectral purity of a radiation beam and the optical element is a grazing incidence mirror configured to create two reflections having a different polarization for the anti-reflection coating.

2. An optical element according to claim 1, wherein the optical element is part of a collector in a lithographic apparatus.

3. An optical element according to claim 1, wherein the anti-reflection coating is configured to prevent certain wavelengths of radiation from being reflected.

4. An optical element according to claim 1, wherein substantially only EUV radiation is reflected.

5. An optical element according to claim 1, wherein about 70–90% of EUV radiation is reflected.

6. An optical element according to claim 1, wherein the thickness of the anti-reflection coating is configured so that the optical pathlength traveled by the radiation beam through the anti-reflection coating is about ¼ $\lambda$.

7. An optical element according to claim 1, wherein an 80 nm thick $CaF_2$ layer is used as an anti-reflection coating.

8. An optical element according to claim 1, wherein the anti-reflection coating comprises any suitable anti-reflection material.

9. An optical element according to claim 1, wherein the anti-reflection coating is made from any of magnesium fluoride ($MgF_2$), silicon dioxide ($SiO_2$), titanium dioxide ($TiO_2$), calcium fluoride ($CaF_2$), diamond, amorphous carbon, TiN, SiC or $Si_3N_4$ and combinations thereof.

10. An optical element according to claim 1, wherein the grazing incidence mirror is configured to obtain a set of angles of incidence of 5° to 7°.

11. An optical element according to claim 1, wherein the two reflections are configured to occur on two sides of the grazing incidence mirror.

12. An optical element according to claim 1, wherein the grazing incidence mirror is substantially cross-shaped in order to be able to create two reflections.

13. An optical element according to claim 12, wherein the two reflections are configured to occur on two sides of the grazing incidence mirror.

14. An optical element according to claim 12, wherein the grazing incidence mirror has a substrate made of any suitable material with good heat conductivity.

15. An optical element according to claim 12, wherein the grazing incidence mirror has a substrate made of Si or Cu.

16. An optical element according to claim 1, wherein the EUV radiation is configured to be reflected on two sides of the surface of the grazing incidence mirror in order to reduce the angle of incidence.

17. An optical element according to claim 1, wherein the grazing incidence mirror comprises a substrate onto which the anti-reflection coating is coated.

18. An optical element according to claim 17, wherein the substrate is made from silicon or copper.

19. An optical element according to claim 1, wherein a material configured to suppress light at wavelengths other than that of EUV rediation is used for the anti-reflection coating.

20. An optical element according to claim 19, wherein the material is a diamond coating with a thickness of about 20–50 nm.

21. A lithographic apparatus, comprising:
   an illumination system configured to condition a radiation beam;
   a support configured to support a patterning device, the patterning device being configured to impart the radiation beam with a pattern in its cross-section to form a patterned radiation beam;
   a substrate table configured to hold a substrate;
   a projection system configured to project the patterned radiation beam onto a target portion of the substrate; and
   at least one optical element within the lithographic apparatus comprising an anti-reflection coating, wherein the anti-reflection coating is configured to reflect EUV radiation and thereby improve the spectral purity of the radiation beam and the optical element is a grazing incidence mirror configured to create two reflections having a different polarization for the anti-reflection coating.

22. A lithographic apparatus comprising an optical element comprising an anti-reflection coating, wherein the anti-reflection coating is configured to reflect EUV radiation and thereby improve the spectral purity of a radiation beam and the optical element is a grazing incidence mirror configured to create two reflections having a different polarization for the anti-reflection coating.

23. A device manufacturing method, comprising:
providing a radiation beam;
patterning the radiation beam;
projecting the patterned radiation beam or radiation onto a target portion of a substrate; and
reflecting the radiation beam with at least one optical element configured to reflect EUV radiation and thereby improve the spectral purity of the radiation beam, wherein the optical element is a grazing incidence mirror configured to create two reflections having a different polarization for the anti-reflection coating.

24. A device manufactured according to the method of:
providing a radiation beam;
patterning the radiation beam;
projecting a patterned beam of radiation onto a substrate; and
reflecting the radiation beam with at least one optical element configured to reflect EUV radiation and thereby improve the spectral purity of the radiation beam, wherein the optical element is a grazing incidence mirror configured to create two reflections having a different polarization for the anti-reflection coating.

25. A device manufactured according to claim 24, wherein the device manufactured is selected form any of: integrated circuits, integrated optical systems, guidance and detection patterns for magnetic domain memories, liquid crystal displays, and thin-film magnetic heads.

* * * * *